(12) United States Patent
Dally et al.

(10) Patent No.: US 7,782,138 B2
(45) Date of Patent: *Aug. 24, 2010

(54) SIGNALING SYSTEM WITH LOW-POWER AUTOMATIC GAIN CONTROL

(75) Inventors: William J. Dally, Stanford, CA (US); John W. Poulton, Chapel Hill, NC (US)

(73) Assignee: Rambus Inc., Los Altos, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/366,612

(22) Filed: Feb. 5, 2009

(65) Prior Publication Data

US 2009/0201090 A1 Aug. 13, 2009

Related U.S. Application Data

(62) Division of application No. 12/174,583, filed on Jul. 16, 2008, now Pat. No. 7,495,513, which is a division of application No. 11/407,371, filed on Apr. 18, 2006, now Pat. No. 7,498,882.

(51) Int. Cl.
*H03G 3/10* (2006.01)

(52) U.S. Cl. ...................................... 330/279; 330/278

(58) Field of Classification Search ................... 330/279, 330/278, 307
See application file for complete search history.

(56) References Cited

U.S. PATENT DOCUMENTS

| 4,546,326 | A | * | 10/1985 | Van Uffelen et al. | ......... 330/129 |
| 5,917,865 | A | | 6/1999 | Kopmeiners et al. | ......... 375/345 |
| 6,803,818 | B2 | * | 10/2004 | van Amerom | ............... 330/144 |
| 7,167,045 | B1 | | 1/2007 | Son et al. | ..................... 330/130 |
| 7,176,726 | B2 | | 2/2007 | Bock | ........................... 327/18 |
| 7,205,842 | B2 | * | 4/2007 | Gustavsson et al. | ......... 330/279 |

FOREIGN PATENT DOCUMENTS

EP 1037381 9/2000

OTHER PUBLICATIONS

International Search Report and Written Opinion of the International Searching Authority, PCT/US2007/066511, European Patent Office, Feb. 26, 2008, 18 pages.
* cited by examiner

*Primary Examiner*—Henry K Choe
(74) *Attorney, Agent, or Firm*—Mahamedi Paradice Kreisman LLP

(57) ABSTRACT

An integrated circuit device includes a variable-gain amplifier, memory circuit and gain control update circuit. The variable-gain amplifier generates an amplified signal having an amplitude according to a gain control value that is stored, at least during a first interval, within the memory circuit. The update circuit generates an updated gain control value based on the amplified signal during the first interval, and outputs the updated gain control value to the memory circuit to be stored therein at a conclusion of the first interval.

20 Claims, 7 Drawing Sheets

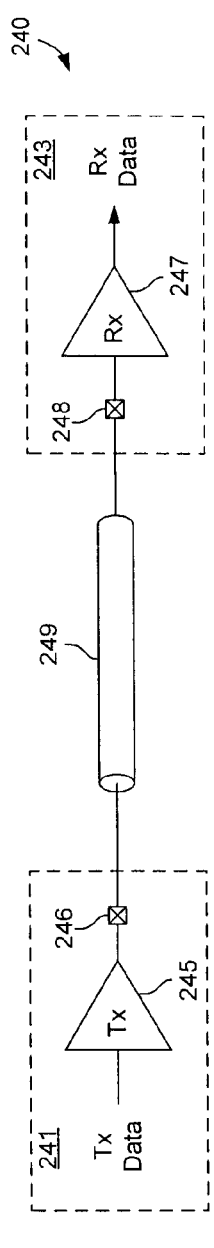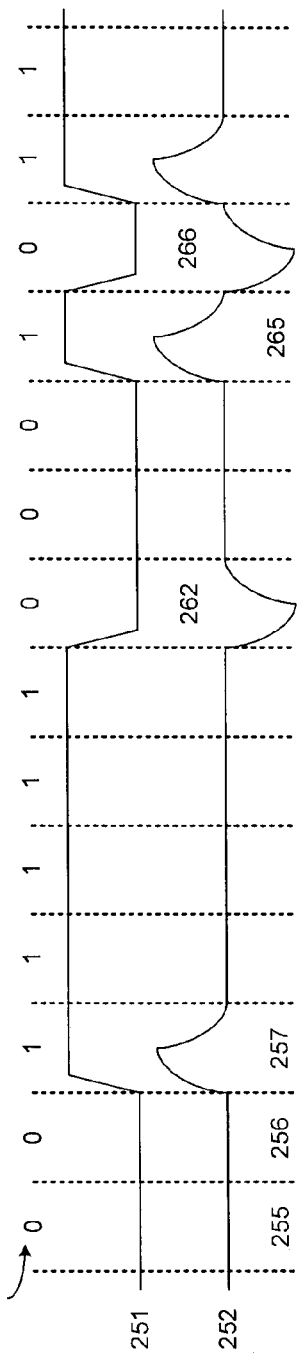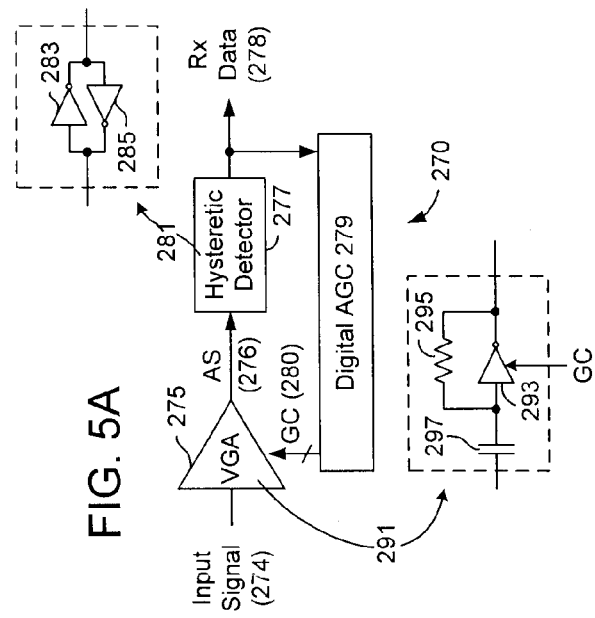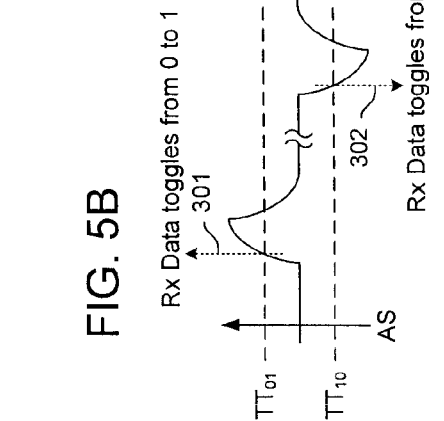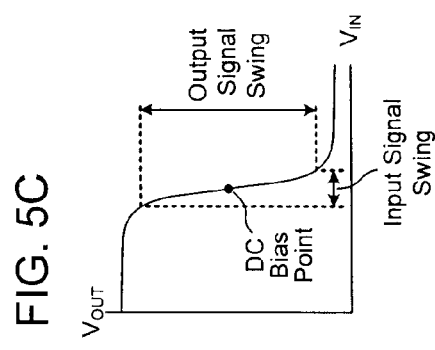
FIG. 4A
FIG. 4B
FIG. 5A
FIG. 5B
FIG. 5C

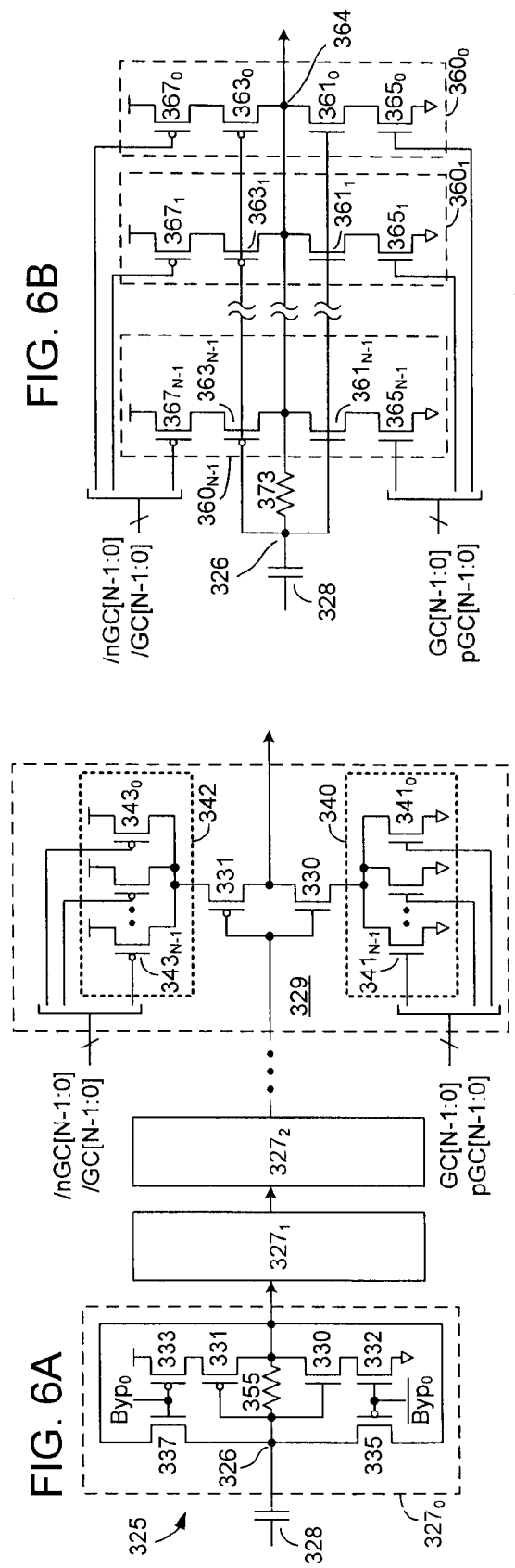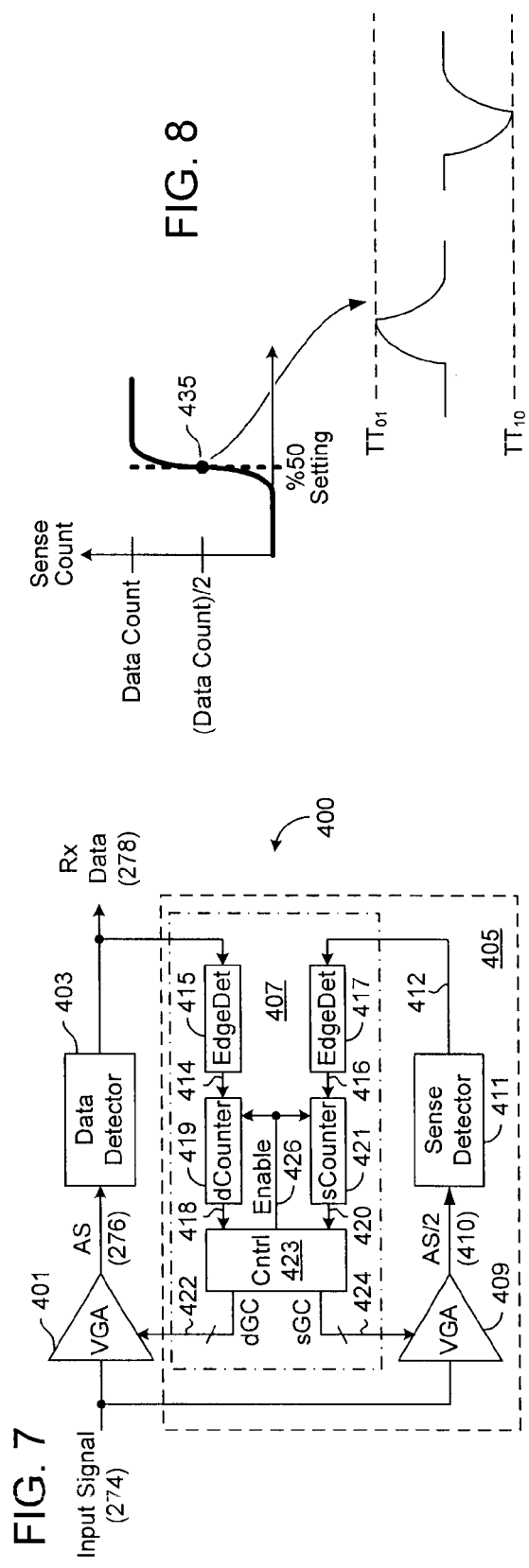

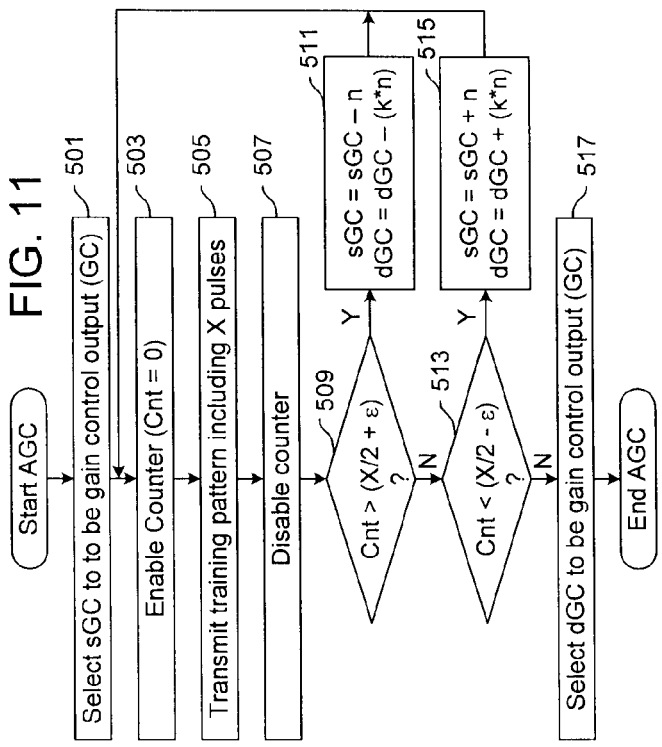
FIG. 9
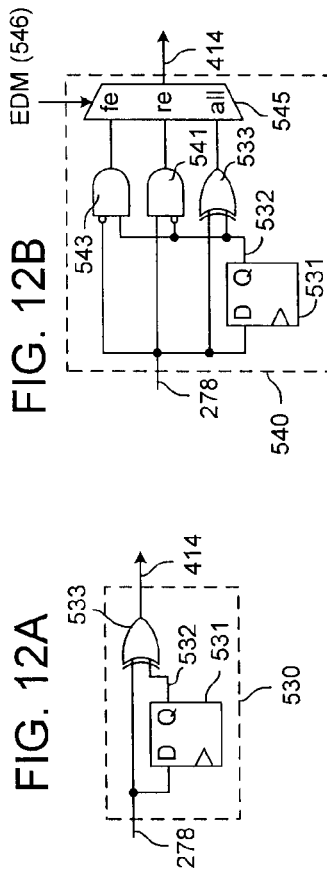
FIG. 11
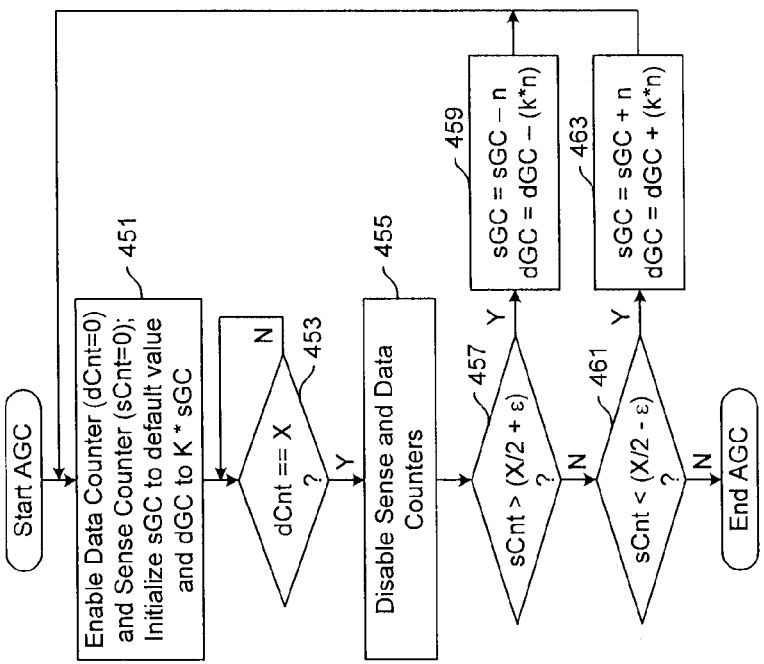
FIG. 10
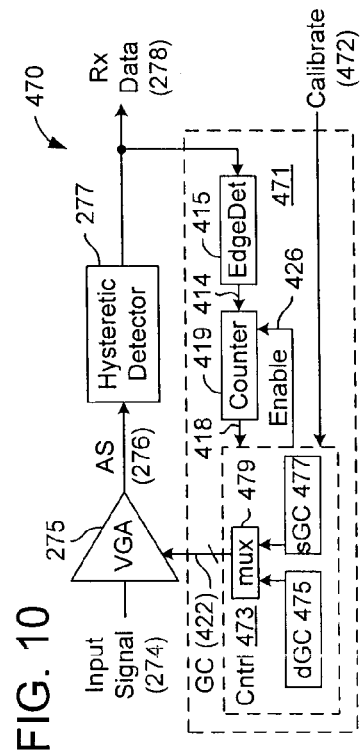
FIG. 12A
FIG. 12B

SIGNALING SYSTEM WITH LOW-POWER AUTOMATIC GAIN CONTROL

CROSS-REFERENCE TO RELATED APPLICATIONS

This application is a division of U.S. patent application Ser. No. 12/174,583, filed Jul. 16, 2008, now U.S. Pat. No. 7,495,513 entitled SIGNALING SYSTEM WITH LOW-POWER AUTOMATIC GAIN CONTROL, which is hereby incorporated by reference in its entirety, and which itself is a division of U.S. patent application Ser. No. 11/407,371, filed Apr. 18, 2006, now U.S. Pat. No. 7,498,882 entitled SIGNALING SYSTEM WITH LOW-POWER AUTOMATIC GAIN CONTROL, which is hereby incorporated by reference in its entirety.

TECHNICAL FIELD

The present invention relates to low-power signaling systems.

BACKGROUND

Automatic gain control (AGC) circuits are widely used to achieve controlled signal amplification in electronic systems. In a typical prior-art AGC circuit, depicted in FIG. 1, an input signal 102 is amplified by a variable-gain amplifier 101 (VGA) to produce an amplified signal 104 that is both output from the AGC circuit and supplied to a gain control loop 103. The gain control loop 103 conventionally includes an envelope detector 105 to detect the peak amplitude of the amplified signal 104, and a comparator 107 to compare the peak amplitude to a desired amplitude 108 and thus generate an error signal 106 that is applied within a filter circuit 109 to adjust the gain of the variable-gain amplifier 101 (i.e., adjust a gain control signal 110) in a direction counter to the error. Thus, the variable-gain amplifier 101 and gain control loop 103 collectively form a negative-feedback circuit that attempts to minimize the error between the desired and amplified signal levels, thereby achieving a desired signal amplification.

One major drawback to the AGC circuit of FIG. 1, is that the gain control loop 103 operates without interruption and thus consumes power continuously. Such continuous power consumption renders the AGC circuit of FIG. 1 increasingly unsuitable for application in the power-constrained environment of modern integrated circuits (ICs) and electronics devices, and particularly in modern IC signaling interfaces where thermal considerations and ever-increasing input/output (I/O) count continue to shrink I/O power budgets.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 4A and 4B illustrate operation of an exemplary pulse-coded signaling system in which embodiments of low-power AGC circuits may be applied;

FIGS. 5A-5C illustrate an embodiment of a pulse-coded signal receiver and operation of amplifier and detector components therein;

FIGS. 6A and 6B illustrate embodiments of inverter-based amplifiers that may be used to implement the variable-gain amplifier depicted in FIG. 5A;

FIG. 7 illustrates a more detailed embodiment of a pulse-coded signal receiver that may be used to implement the pulse-coded signal receiver of FIG. 5A;

FIG. 8 illustrates is a graph of pulse detection versus gain and illustrates the relationship between the height of amplified pulses and a gain control setting that results in detection of half the pulses in a pulse-coded input signal;

FIG. 9 illustrates an exemplary flow diagram for operation of the controller depicted in FIG. 7;

FIG. 10 illustrates an alternative embodiment of a pulse-coded signal receiver;

FIG. 11 illustrates an exemplary gain control update operation that may be carried out by the controller depicted in FIG. 10;

FIGS. 12A and 12B illustrate exemplary embodiments of edge detectors that may be used to implement the data-edge and sense-edge detectors depicted in FIG. 7 and the edge detector depicted in FIG. 10;

DETAILED DESCRIPTION

Figure 1:
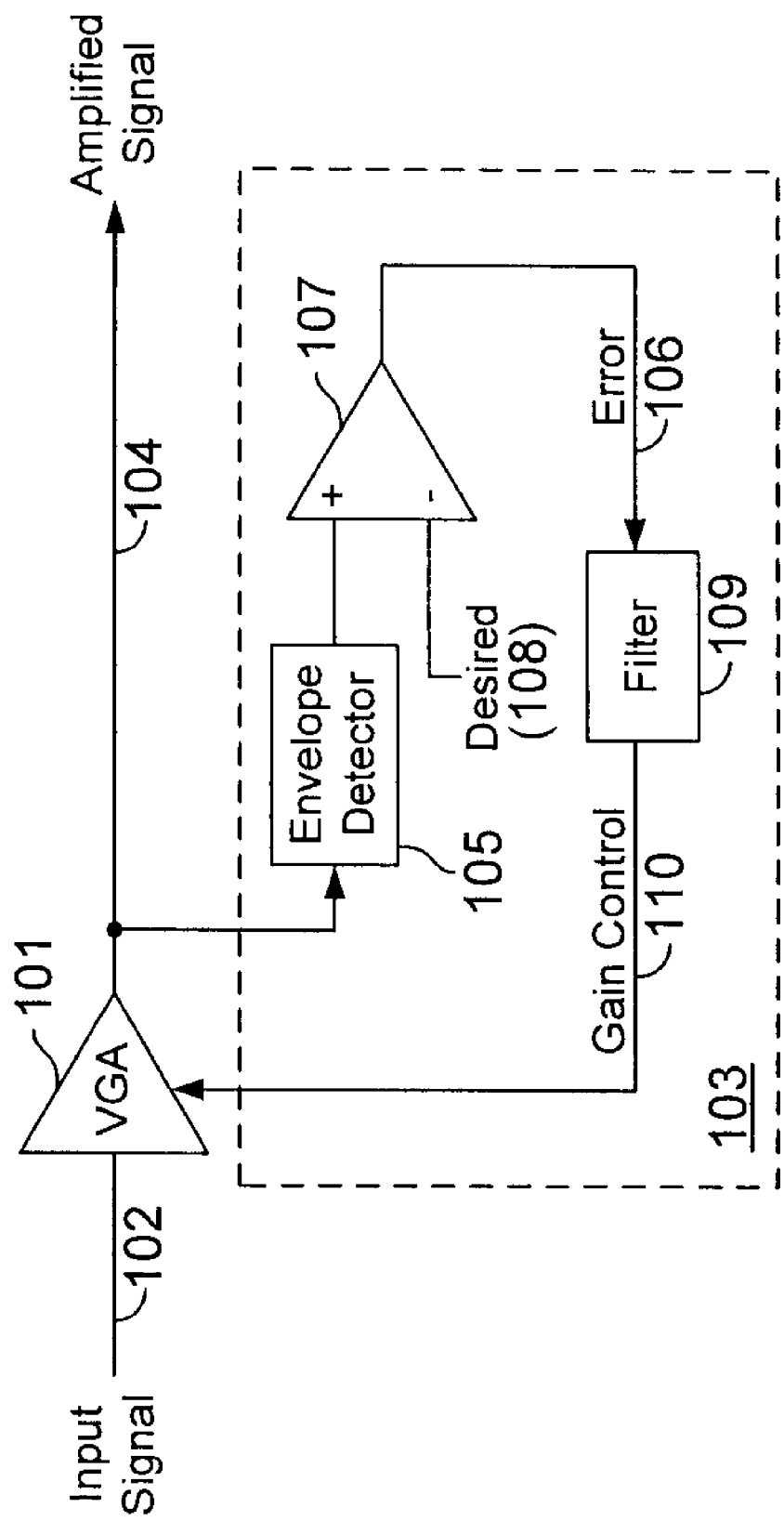
FIG. 1 illustrates a prior-art automatic gain control (AGC) circuit.

Low-power automatic gain control (AGC) circuits are disclosed in various embodiments along with devices and systems incorporating such circuits. In one embodiment, a storage circuit referred to herein as a gain control memory is provided to store a gain control value generated by an update loop within an AGC circuit, and to output the gain control value to a variable-gain amplifier. By this arrangement, after the gain control value has been adjusted to achieve a desired amplification level within the variable-gain amplifier, the update loop or portions thereof may be disabled to save power, leaving the gain control memory to maintain the gain control value and thus the desired amplification level. Thereafter, the update loop may be periodically or occasionally re-enabled to compensate for drift in the desired amplification level due, for example, to changes in temperature or voltage.

In one implementation, the update loop within the AGC generates an analog gain control signal which is converted to digital form (i.e., a digital gain control value) before being provided to the gain control memory. The gain control memory may include a digital-to-analog converter (DAC) to perform a counterpart digital-to-analog conversion and thus output an analog gain control signal to the variable-gain amplifier or, alternatively, the variable-gain amplifier may itself include digital gain control circuitry and therefore may receive the digital gain control value directly from the gain control memory. For example, the variable-gain amplifier may include one or more digital-to-analog converters that operate as amplifier biasing circuits and thus control amplifier gain.

In another implementation, the update loop within the AGC circuit is entirely or predominantly digital thus forming a digital AGC circuit that includes, for example, an analog-to-digital converter (ADC) to generate a sequence of digitized samples of the amplified signal, and a digital update circuit to process the samples into a corresponding sequence of updated digital gain control values. The updated digital gain control values may be stored one after another in the gain control memory and thus sequentially applied to control the gain of the variable-gain amplifier.

In one embodiment, a digital AGC circuit is applied within a signal receiver to amplify a pulse-coded input signal to a level that enables information-bearing pulses in the incoming signal to be distinguished from noise. In a particular implementation, the AGC circuit is used to adaptively determine a gain control value that establishes the median amplitude of the incoming pulses at the threshold of a level-detecting circuit, thus enabling an operating gain control value to be determined, for example, as a multiple of the median-detection gain control value. In another implementation, the gain control value is stepped through a sequence of below-nominal values to estimate a false-negative bit error rate as a function of gain by determining respective numbers of non-detected input signal transitions at the different gain control values, and is similarly stepped through a sequence of above-nominal values to estimate a false-positive bit error rate as a function of respective numbers of spurious input signal transitions detected at the different gain control values. A gain control setting that yields a theoretically balanced false-positive and false-negative bit error rate may then be determined and applied within the variable-gain amplifier to achieve the desired amplification level. In both implementations, the AGC circuit or components thereof may be disabled to save power once a desired gain control value has been determined and stored in the gain control memory. These and other embodiments, features and aspects of the invention are described in further detail below.

Figures 2, 3:
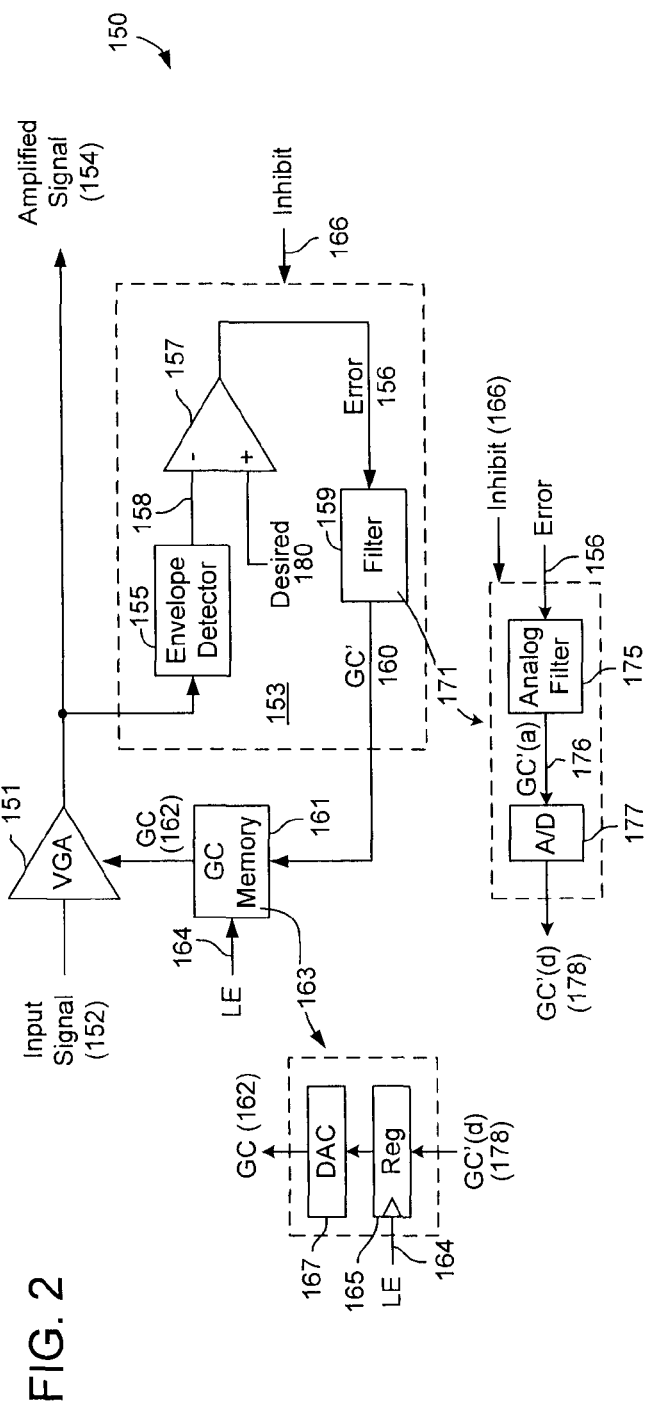
FIG. 2 illustrates an embodiment of a low-power AGC circuit.
FIG. 3 illustrates an alternative embodiment of a low-power AGC circuit.

FIG. 2 illustrates an embodiment of a low-power AGC circuit 150 that may be used within an input signal receiver of an integrated circuit device or in any other application in which low-power automatic gain control is desirable. As shown, the AGC circuit 150 includes a variable-gain amplifier 151, update circuit 153 and gain control memory 161. The variable-gain amplifier 151 amplifies an input signal 152 in accordance with a gain control value 162 (GC) received from the gain control memory 161 to produce an amplified signal 154. The amplified signal 154 is output from the AGC circuit 150 (for example, for use by other circuitry within the integrated circuit device) and is also supplied to the update circuit 153. In general, the update circuit 153 compares the amplified signal level to a desired signal level to generate an updated gain control value, referred to herein as a gain control update 160 (GC'), which is periodically or occasionally stored within the gain control memory 161 to establish a new, adjusted gain control value 162. In one embodiment, control circuitry, not shown in FIG. 2, is provided to determine when the amplified signal has stabilized at a desired signal level (or within a desired range of signal levels), for example, by detecting dithering of the gain control value 162 (or gain control update 160). The control circuitry may respond to detection of the stabilized condition by asserting an inhibit signal 166 to disable operation of the update circuit 153 and thus conserve power. Thereafter, the inhibit signal 166 may be occasionally or periodically deasserted (e.g., during calibration intervals or in response to threshold error detection, commands from a remote control device or other conditions which indicate need to adjust the gain control value) to enable the automatic gain control operation of the update circuit 153.

In the particular embodiment of FIG. 2, the update circuit 153 includes an envelope detector 155, comparator 157 and filter 159. The envelope detector 155, which may be implemented, for example by a diode and a shunt capacitor (or by any other envelope-detecting circuit), detects a peak level of the amplified signal 154 (which may be a relative minimum or maximum, or both) and outputs the peak signal level 158 to the comparator 157. The comparator 157 compares the peak signal level 158 with a desired signal level 180 and generates an error signal 156 that indicates whether the peak signal level 158 exceeds or does not exceed the desired signal level 180. The comparator 157 may be implemented, for example and without limitation, by a differential amplifier or operational amplifier that generates an error signal 156 having a sign and magnitude according to the sign and magnitude of the difference between the peak and desired signal. Alternatively, the comparator 157 may generate a bi-stable error signal 156 that is high or low according to the sign of the difference between the peak and desired signal levels.

The error signal 156 is provided to the filter circuit 159 which may include any number of passive or active components to filter the error signal 156 (e.g., smooth, average or otherwise suppress transients) and stabilize the gain control loop formed by the update circuit 153, gain control memory 161 and variable-gain amplifier 151. The output of the filter 159 is referred to herein as a gain control update 160 (GC') and is supplied to the gain control memory 161 to be stored therein in response to a load-enable signal 164 (LE).

In one embodiment, the load-enable signal 164 and inhibit signal 166 are each controlled by a control circuit or timing circuit within the host integrated circuit device (i.e., the integrated circuit device that includes the AGC circuit 150) and may be asserted periodically or in response to various operating conditions or events. For example, in a particular implementation, the load-enable signal 164 is asserted at the conclusion of each of a sequence of error detection intervals for which the inhibit signal 166 is deasserted. The error detection intervals may be established by a clock cycle count (e.g., counting a predetermined number of clock cycles) or input signal transitions (e.g., counting a predetermined number of input signal transitions) or any other interval-control technique. The load-enable signal 164 and/or inhibit signal 166 may alternatively be controlled by circuitry external to the host integrated circuit device.

The gain control memory 161 may be implemented by any type of volatile or non-volatile memory circuit, including a digital storage circuit such as a multi-bit register (or latch) or an analog memory element. In one embodiment, shown in detail view 163, the memory circuit 161 includes a digital storage circuit 165 (Reg) to store a digital gain control update 178 (GC'(d)) in response to assertion of load-enable signal 164, and a digital-to-analog converter 167 (DAC) to convert the contents of the digital storage circuit 165 to an analog gain control signal 162 (GC). In such an embodiment, the filter circuit 159 may include an analog-to-digital converter 177 (ADC) as shown in detail view 171 to convert an analog gain control update 176 (GC'(a)) received from an analog filter circuit 175 to digital gain control update 178.

Still referring to FIG. 2, when the inhibit signal 166 is asserted, the envelope detector 155, comparator 157, filter 159 or any subset thereof may be disabled to save power. More specifically, power to one or more of the operational circuits within any or all of the detector 155, comparator 157 and filter 159, may be switched off, and/or input signal transitions to such circuits suppressed (e.g., by decoupling such circuits from a signal input path and/or discharging the input node of the circuits). The load-enable signal 164 may be disabled from being asserted when the inhibit signal 166 is asserted, thereby preventing invalid gain control updates 160 from being loaded into gain control memory 161.

In an embodiment in which analog filter components are used to implement filter 159, assertion of the inhibit signal 166 may result in loss of filter memory (e.g., discharge of discrete components therein) so that, if the inhibit signal 166 is later deasserted to enable operation of the update circuit 153, the load-enable signal 164 may remain deasserted for a number of error detection intervals after inhibit signal deassertion to enable the filter memory to be restored before loading gain control updates 160 into the gain control memory 161, thereby reducing the chance of loading an invalid gain control update.

FIG. 3 illustrates an embodiment of a low-power AGC circuit 200 having a variable-gain amplifier 201, digital update circuit 203 and gain control memory 215. As in the embodiment of FIG. 2, the variable-gain amplifier 201 amplifies an input signal 152 in accordance with a gain control value 210 (GC) to generate an amplified signal 154. The digital update circuit 203 includes, as component circuits, an analog-to-digital converter 205 (ADC), digital detector 207, digital comparator 209 and digital filter 211, and is coupled to receive the amplified signal 154 as well as a sample signal 212 and frame signal 214 that are used to trigger operation of the component circuits. More specifically, the ADC 205 responds to assertions of the sample signal 212 by generating respective digital samples 202 of the amplified signal 154 (e.g., a multiple-bit value that indicates the amplitude or relative amplitude of the amplified signal) and thus supplies a sequence of digital samples to the digital detector 207. The digital detector 207 determines the peak digital sample (which may include a maximum and/or minimum sample) within the sequence of digital samples 202 output from the ADC 205 over an error detection interval marked by successive assertions of frame signal 214. In one embodiment, for example, the digital detector 207 includes a temporary buffer and comparison logic that are used to determine the peak digital sample for a given error detection interval, and a peak-sample buffer that is used to hold the peak digital sample determined during the immediately preceding error detection interval. In general, each digital value generated by the ADC 205 during a given error detection interval is compared with the contents of the temporary buffer (i.e., through operation of the comparison logic) and, if determined to exceed the temporary buffer contents, is stored within the temporary buffer as the peak value so far detected within the error detection interval. At each frame signal assertion, the peak value recorded within the temporary buffer is transferred to the peak-sample buffer and the temporary buffer is reset (e.g., to a value sure to be matched or exceeded by an incoming digital sample 212 during the ensuing error detection interval).

At each assertion of frame signal 214, the digital comparator 209 compares the peak sample 204 recorded by the digital detector 207 (i.e., received from the peak-sample buffer therein) with a desired peak value 213 to generate an updated error signal 206. The desired peak value 213 may be, for example, a hardwired digital value or a digital value stored within a volatile or non-volatile register (e.g., a programmable register) of the host integrated circuit device. Also, in one embodiment, the error signal 206 includes a sign bit that indicates whether the peak sample 204 exceeds the desired peak value 213 or vice-versa and may additionally include a magnitude component that indicates a magnitude of the difference between the peak sample 204 and desired peak value 213. In either case, the updated error signal 206 is supplied to the digital filter 211 which responds to each assertion of the frame signal 214 by applying the updated error signal 206 in a filtering operation to generate a filtered gain control update 208 (GC'). In one embodiment, the digital filter 211 is a finite impulse response filter that applies the updated error signal 206 in a filtering operation along with a finite number of the most recently received error signals 206. In an alternative embodiment, the digital filter may be implemented by an infinite impulse response filter that accumulates the updated error signal 206 into a running total (e.g., a running average). More generally, the digital filter 211 may be any type of filter and may perform any number of operations to smooth, average or otherwise suppress transients of the error signal 206 and to stabilize the gain control loop.

In one embodiment, a load-enable input of the gain control memory 215 is coupled to receive a load-enable signal 216 that, at least initially, is asserted in response to (or coincidentally with) each frame signal 214 to load the updated gain control value 208 into the gain control memory 215 and thereby iteratively adjust the gain control value 210 supplied to the variable-gain amplifier 201. As shown, the variable-gain amplifier 201 may include a DAC 220 to receive a digital gain control value 210 from the gain control memory 215 (e.g., implemented by a register, latch or the like) and to control amplification within the variable-gain amplifier 201 accordingly. Alternatively, the DAC 220 may be included within or considered to be part of the gain control memory 215.

Still referring to FIG. 3, it should be noted that sample signal 212 and frame signal 214 may each be asserted periodically so that the AGC circuit 200 may be operated without interruption. Alternatively, the sample signal 212 and frame signal 214 (which may be asserted once for every N sample signal assertions according to the desired number of digital samples per error detection interval) may be held at a steady-state to prevent operation of the update circuit 203, thus maintaining the gain control value 210 most recently stored within the gain control memory 215 to control the gain of the variable-gain amplifier 201 and effecting a low power mode of operation within the AGC circuit 200. Thereafter, cycling of the sample signal 212 and frame signal 214 may occasionally be enabled, for example, to restore AGC operation and thus compensate for drift between the desired and actual gains within the variable-gain amplifier 201. As with the AGC circuit 150 of FIG. 2, it may be desirable to operate the update circuit 203 for a limited number of error detection intervals before enabling assertion of the load-enable signal 216 to enable the digital filter 211 to be primed by a fresh set of error signals 206. Also, the digital samples 202 generated by ADC 205 constitute an amplified digital signal that may be supplied to other components within the host integrated circuit device, for example, as an alternative to (or in addition to) amplified signal 154. Alternatively, one or more additional ADC circuits may be provided to generate digital samples of the amplified signal 154 for use within other circuit components of the host integrated circuit device.

FIGS. 4A and 4B illustrate operation of an exemplary pulse-coded signaling system 240 in which embodiments of low-power AGC circuits may be applied. Referring first to FIG. 4A, the signaling system 240 includes a pair of integrated circuit devices 241 and 243 interconnected by a signaling path 249. In the particular embodiment shown, integrated circuit device 241 includes a pulse-coded transmitter 245 to output transmit data (Tx Data) 245 onto the signaling path, and integrated circuit device 243 includes a pulse-coded receiver 247 to recover receive data (Rx Data) from the pulse-coded transmission. Though a unidirectional signaling link is depicted, integrated circuit device 241 may additionally include a pulse-coded receiver coupled to signaling path 249, and integrated circuit device 243 may include a counterpart pulse-coded transmitter coupled to signaling path 249. Alternatively, separate unidirectional signaling links may be provided for pulse-coded signal transmission and reception. Also, other pulse-coded transmitters and/or receivers may be provided within the integrated circuit devices 241 and 243 to establish n-bit wide signaling paths that may be used to convey data words, command words, address values and/or any other information to be conveyed between the integrated circuit devices. Further, while contact pads 246 and 248 are depicted as interconnect nodes between the external signal path 249 and on-die segments of the signal path 249, any type of signal interconnection structures may be used as signal input/output (I/O) nodes, including contactless interconnects through which signals may be capacitively or inductively coupled. Further, on-die and/or off-die termination structures may be permanently or switchably coupled to the signaling path 249 to effect a controlled impedance (e.g., to establish transmission line characteristics) over the signaling path 249, and one or more additional signaling paths may be provided to convey timing information (e.g., clock or strobe signals) for establishing signal transmission and/or reception times within the integrated circuit devices. The integrated circuit devices 241 and 243 themselves may be separately packaged and disposed on a common printed circuit board or on separate printed circuit boards (e.g., on respective daughterboards interconnected by a backplane or motherboard, or on a motherboard and daughterboard), or disposed within a common integrated circuit package such as a multi-chip module, paper-thin package, system-on-chip, system-in-package, etc. Also, instead of being disposed on separate integrated circuit dice (also referred to herein as chips), the transmitter 245 and receiver 247 may be disposed on a common die and the signal path 249 formed in one or more conductive layers (e.g., metal layers) of the die. The signaling system 240 may be included within any type of electronic system in which chip-to-chip signaling is required including, for example and without limitation, various types of computing devices and consumer electronics devices (e.g., computers, networking devices, cell phones, media players, handhelds, televisions, set-top boxes, etc.).

FIG. 4B illustrates an exemplary sequence of transmit data bits 250, and corresponding binary-coded and pulse-coded waveforms 251 and 252. The binary-coded waveform 251 is also referred to as a non-return to zero (NRZ) waveform as the output signal is at all times either high or low to represent the corresponding transmit data bit. Thus, the waveform is low during the first two transmission intervals shown, 255 and 256, to transmit sequential logic '0' data bits, then goes high in transmission interval 256 to transmit a logic '1' bit. Thereafter, the waveform remains high to transmit a sequence of logic '1' bits, and then goes low again in transmit interval 262 to transmit a sequence of logic '0' data bits. A maximum signal switching frequency occurs whenever a logic '1' data bit is transmitted between two logic '0' data bits as in transmit interval 265, or when a logic '0' data bit is transmitted between two logic '1' data bits as in transmit interval 266.

In the pulse-coded waveform 252, positive and negative pulses are transmitted to signal changes in the transmit data state. That is, each transmit data transition from a logic '0' to a logic '1' state is signaled by a positive pulse as shown in transmit intervals 257 and 265, and each transmit data transition from a logic '1' to a logic '0' state is signaled by a negative pulse as shown at transmit intervals 262 and 266. No pulses are transmitted during sequences of same-state transmit data as, for example, between transmit intervals 257 and 262. By this signal-encoding arrangement, referred to herein as pulse-coding (or delta encoding, as only data-state changes in the transmit data bit stream are explicitly signaled), the total signaling power may be substantially reduced due to the reduced number of signal driving events in the pulse-coded transmitter. That is, because the probability of a given transmit data bit being succeeded by a same-state transmit data bit is 50% (i.e., assuming a random and continuous stream of transmit data bits 250), the number of signal driving events (i.e., where a signal is actually being driven onto signal path 249 by the transmit circuit) is theoretically reduced by 50%. Where a long stream of logic '1' or logic '0' data is to be transmitted (e.g., during a quiet period on the signaling link), the transmit power consumption may drop considerably further.

In FIG. 4B, the positive and negative pulses are depicted as capacitor charge/discharge waveforms to emphasize the capacitive nature of the signaling path. The pulses may have various different shapes according to the signaling path characteristics, output and input impedances at the transmitter and receiver, and signal equalization applied within the transmitter and/or receiver (e.g., transmit pre-emphasis and/or decision-feedback equalization). Also, while depicted as single-ended signals in FIG. 4B and generally described as such in embodiments detailed below, in all such cases, the pulse-coded signal 252 may alternatively be a differential signal formed by complementary component signals and the signaling-system components modified to accommodate differential signal transmission and reception.

FIGS. 5A-5C illustrate an embodiment of a pulse-coded signal receiver 270 and operation of amplifier and detector components therein. Referring first to FIG. 5A, pulse-coded signal receiver 270 includes a variable-gain amplifier 275, hysteretic detector 277, and digital AGC circuit 279. The variable-gain amplifier 275 amplifies a pulse-coded input signal 274 in accordance with a gain control value 280 (GC) from AGC circuit 279 to deliver an amplified signal (AS) 276 to the hysteretic detector 277. In one embodiment, shown at 281, the hysteretic detector 277 is implemented by a pair of inverters 283 and 285 coupled in a flip-flop configuration (i.e., output of each inverter coupled to input of the other) and may thus be toggled between bi-stable states (i.e., logic '0' to logic '1' or logic '1' to logic '0') in response to positive and negative pulses in the amplified signal. More specifically, as shown in FIG. 5B, a positive pulse that exceeds a positive (0-to-1) toggle threshold ($TT_{01}$) will cause the detector 277 to toggle from a logic '0' state to a logic '1' state as shown at 301, and a negative pulse that exceeds a negative (1-to-0) toggle threshold ($TT_{10}$) will cause the detector to toggle from a logic '1' state to a logic '0' state as shown at 302. That is, in the 0-to-1 transition, the amplified signal 276 rises to a level that overcomes the logic '0' output of inverter 283 (i.e., above the positive toggle threshold), thus causing the detector 277 (i.e., the storage element formed by the inverter pair) to flip to the alternate bi-stable state. Conversely, in the 1-to-0 transition, the amplified signal 276 drops to a level that overcomes the logic '1' output of inverter 285 (i.e., below the negative toggle threshold), thus causing the detector state to toggle. Note that the output of the detector 277 is inverted relative to the state stored therein (i.e., considering the stored state to be the signal level at the output of inverter 285, which corresponds to the most recently captured state of the amplified signal 276) due to the inversion performed by inverter 283. Though not shown in FIG. 5A, an additional inverter may be provided at the output of detector 277 to establish equivalence between captured and output states of detector 277. In any case, the bi-stable nature of the detector 277 provides hysteresis in the transition between the bi-stable states of the detector 277 so that the detector output 278 (i.e., the received data signal 278) does not change states in absence of pulses that exceed the upper or lower toggle thresholds. Also, by powering the component inverters of the detector 277 with logic level supply and ground voltages, the resulting detector output signal 278 is a logic-level signal having either a logic '0' or logic '1' data state in each data reception interval. Accordingly, so long as incoming positive and negative pulses are amplified to levels that exceed the positive and negative toggle thresholds $TT_{01}$ and $TT_{10}$, without amplifying noise beyond those levels, the signal receiver 243 will recover a stream of receive data bits from the incoming pulse-coded signal 274 that corresponds to the original transmit data stream.

Returning to FIG. 5A, the variable-gain amplifier 275 may be implemented by virtually any type or number of amplifier stages. In one embodiment, shown for example in detail view 291, each stage of the variable-gain amplifier 275 is implemented by an inverter 293 having a feedback-coupled resistive element 295 (which may be a resistor or an active load) to establish a DC bias point at the center of the linear amplification region of the inverter as shown in FIG. 5C. Each amplifier stage or any of the stages may include an input capacitor 297 (e.g., formed by a capacitor-configured transistor) and thus be AC-coupled to the preceding stage or input signal node. In a particular implementation, the incoming pulse-coded signal may range from roughly ±3 mV to ±100 mV and may need to be amplified to levels as high as ±1 volt or beyond. Accordingly, as the inverting amplifier shown at 291 generally exhibits a gain less than 10, multiple inverting amplifier stages 291 may be coupled in series to provide the necessary gain, with bypass options for one or more of the stages (e.g., switchable shunt paths) to accommodate lower gains.

FIGS. 6A and 6B illustrate embodiments of inverter-based amplifiers (325 and 355) that may be used to implement the variable-gain amplifier 275 of FIG. 5A. Referring first to FIG. 6A, a series of inverting amplifier stages ($327_0$, $327_1$, $327_2$, etc.) are coupled in series, with a final amplifier stage 329 having biasing DACs 340 and 342 coupled between the supply voltage nodes and inverting transistors 330 and 331 to form a current-starved inverter stage. To extend the amplification range of the multi-stage amplifier, shut-down transistors 332 and 333 and bypass transistors 335 and 337 may be included in one or more of stages 327 to enable the stages to be selectively bypassed, for example, in response to a programmed mode bypass control value, Byp[k–1:0], where k is the number of bypass-able stages 327. In the detail view of inverting amplifier stage $327_0$, for example, when a bypass signal, $Byp_0$, is raised (and complementary signal/$Byp_0$ lowered), shut-down transistors 332 and 333 are switched off to disable operation of the inverter formed by transistors 330 and 331, and the transfer gate formed by bypass transistors 335 and 337 is switched on to conduct the incoming signal to the input of the subsequent inverting amplifier stage $327_1$, thus bypassing the inverting amplifier stage $327_0$. Other bypass arrangements may be used in alternative embodiments.

In one embodiment, biasing DAC 340 within the final amplifier stage 329 is formed by N binary-weighted transistors $341_0$-$341_{N-1}$ (e.g., having progressively doubled width/length ratios (W/L) such that W/L of each of the transistors $341_i$ is given by $2^{i+1} \times W/L_{MIN}$, where i ranges from 0 to N–1 and $W/L_{MIN}$ is the width/length ratio of the smallest transistor $341_0$) having grounded source terminals, commonly coupled drain terminals and gate terminals coupled to receive respective bits of gain control value GC[N–1:0]. Biasing DAC 342 is similarly formed by binary-weighted transistors $343_0$-$343_{N-1}$ having supply-coupled source terminals, commonly coupled drain terminals and gate terminals coupled to receive respective bits of complementary gain control value/GC[N–1:0]. In this arrangement, the biasing transistors $341_0$-$341_{N-1}$ may be viewed collectively as a variable-width n-MOS transistor (i.e., n-type metal oxide semiconductor transistor) and biasing transistors may similarly be viewed collectively as a variable-width p-MOS transistor. That is, as the gain control value, GC, is incremented or decremented, the width of the collective transistor formed by transistors 341 and the width of the collective transistor formed by transistors 343 is incremented or decremented accordingly to increase or decrease the gain of the final amplifier stage. In alternative embodiments, thermometer coding or other techniques may be used to achieve effective binary weighting of the paths controlled by respective bits of the gain control value. Also, non-binary weighting schemes such as linear weighting (all transistors 341 and/or 343 the same size), exponential weighting, and so forth, may be used in alternative embodiments. As shown, in an alternative embodiment, separate positive and negative gain control values, pGC[N–1:0] and nGC[N–1:0], may be provided to control DACs 340 and 342, thus enabling separate gain control for amplification of positive pulses (amplified primarily by the setting of DAC 340) and negative pulses (amplified primarily by the setting of DAC 342).

FIG. 6B illustrates an alternative embodiment of a variable-gain amplifier 355 formed by parallel-coupled current-starved inverters $360_0$-$360_{N-1}$. More specifically, the signal inputs of the current-starved inverters 360 are coupled to a common input node 326, and the signal outputs of the inverters 360 are coupled to a common output node 364, and a resistive element 373 is coupled between the input and output nodes to establish a DC bias point. By this arrangement, the core inverters formed by transistors $361_0$-$361_{N-1}$ and $363_0$-$363_{N-1}$ form, collectively, a high-gain inverter element (i.e., the constituent transistors $361_0$-$361_{N-1}$ and $363_0$-$363_{N-1}$ are ganged to provide high transconductance ratios). Transistors $365_0$-$365_{N-1}$ and $367_0$-$367_{N-1}$ form positive and negative gain-control DACs, respectively, that control the applied voltage across the core inverter transistors $361_0$-$361_{N-1}$ and $363_0$-$363_{N-1}$, and thus control the overall gain of the amplifier. In one embodiment, the positive gain-control DAC is implemented by binary weighted n-MOS transistors 365 coupled to receive respective bits of gain control value, GC[N–1:0], and the negative gain-control DAC is similarly implemented by binary weighted p-MOS transistors 367 coupled to receive respective bits of complement gain control value, /GC[N–1:0]. As in the embodiment of FIG. 6A, the positive and negative gain-control DACs may alternatively be controlled by separate positive and negative gain control values (pGC[N–1:0] and nGC[N–1:0]) to permit divergent positive and negative gain settings to be established. Also, thermometer coding may be used to achieve binary weighting and/or other types of transistor weighting schemes may be used.

Still referring to FIGS. 6A and 6B, both of the variable-gain amplifiers are depicted as being capacitively coupled (i.e., via capacitive elements 328) to an input signal node 326. The variable-gain amplifiers may alternatively be directly coupled to the input node in alternative embodiments. More generally, while specific amplifier implementations have been described, any amplifier circuit having controllable gain may be used to implement variable-gain amplifiers within the embodiments described herein.

FIG. 7 illustrates a more detailed embodiment of a pulse-coded signal receiver 400 that may be used to implement the pulse-coded signal receiver 270 of FIG. 5A. Receiver 400 includes a pair of variable-gain amplifiers, 401 and 409, and a corresponding pair of hysteretic detectors, 403 and 411. Amplifier 401 and detector 403, referred to herein as a data amplifier and data detector, correspond to the amplifier 275 and detector 277 of FIG. 5A and, like their counterparts, are used to recover a stream of received data values 278 (Rx Data) from a pulse-coded input signal 274. Amplifier 409 and detector 411 are referred to herein as a sense amplifier and sense detector and, together with gain control logic 407, form a digital AGC circuit 405. In one embodiment, the digital AGC circuit 405 establishes a data gain control value 422 (dGC) for the data amplifier 401 by determining a sense gain control value 424 (sGC) that, when applied within the sense amplifier 409, results in detection (within the sense detector 411) of half the total number of incoming pulses, X, transmitted in a given error detection interval, and setting the data gain control value 422 to be a scaled version of the sense gain control value, dGC=k×sGC, where k>1.

Referring to FIG. 8, the gain at which half the incoming pulses (X/2) are detected by the sense detector 411 corresponds to an amplification that centers the heights of the amplified pulses at the toggle thresholds, $TT_{01}$ and $TT_{10}$. That is, at the desired sense gain control setting, half the pulses exceed a toggle threshold (either $TT_{01}$ or $TT_{10}$) and are thus sensed by the sense detector 411 and included within a sense pulse count, and half the pulses fall below the toggle threshold (i.e., are less than $TT_{01}$ or greater than $TT_{10}$) and are not sensed by the sense detector 411 and therefore not included within the sense pulse count. Consequently, as shown by point 435 in FIG. 8, the desired sense gain control setting, referred to herein and shown in FIG. 8 as the 50% setting, in effect, establishes the median pulse height of amplified signal 410 at the toggle threshold of the sense detector 411 and thus provides a useful measure of the toggle threshold in relation to the sense gain control setting. For example, knowing that the 50% setting yields amplified pulses that just scrape the toggle threshold of sense detector 411 and that sense detector 411 and data detector 403 should have substantially similar toggle thresholds, the data gain control value 422 may be set as a fixed or programmable multiple of the sense gain control value 424, with the multiple selected to ensure reliable detection without raising the noise floor of the input signal 274 above the toggle threshold. In one embodiment, for example, a scaling factor (i.e., multiplier) of two (2) is applied so that, with substantially linear amplification of the input signal 274, the pulse height of the amplified signal 276 should be centered at approximately twice the toggle threshold of the data detector 403 (i.e., toggle threshold at 50% of the amplified pulse height and thus slices the amplified pulses in half).

Returning to FIG. 7, in one embodiment, the gain control logic 407 includes data-edge and sense-edge detectors, 415 and 417 (EdgeDet), to detect edges (i.e., transitions) in the received data signal 278 and sense signal 412, respectively, together with data and sense counters, 419 and 421 (dCounter and sCounter), to count the edges signaled by the edge detectors 415 and 417. More specifically, data counter 419 counts edge-detect signals 414 from data-edge detector 415, and outputs the resulting data-edge count value 418 to a controller 423 and, similarly, sense counter 421 counts edge-detect signals 416 from sense-edge detector 417 and outputs the resulting sense-edge count value 420 to controller 423. The controller 423, which may be implemented by a state machine, microcontroller or any other processor or control logic, frames the error detection intervals, resetting the data and sense counters, 419 and 421 (i.e., resetting the data-edge count and sense-edge count to zero), and updating the corresponding gain control values, dGC and sGC at the conclusion of each error detection interval. In the embodiment shown, the gain control memory is included within controller 423, though the gain control memory may be disposed elsewhere in alternative embodiments.

FIG. 9 illustrates an exemplary flow diagram for operation of the controller 423 of FIG. 7. At the start of a gain control update interval ("start AGC"), the controller 423 asserts enable signal 426 to enable the data counter 419 and sense counter 421 to count edge detections signaled by corresponding edge detectors 415 and 417, and resets the data count (dCnt) and sense count (sCnt) to zero (or some other initial value) as shown at 451. Also, as shown at 451, the sense gain control value (sGC) is initialized to a default value and the data gain control value (dGC) is initialized to k times the default value (k * sGC). Thereafter, as shown at 453, the data counter output (i.e., the data count) is compared with a fixed or programmable terminal count, X, that establishes the number of pulses that are to be received within each error detection interval. Thus, in the embodiment of FIG. 9, error detection intervals are framed by detection of a desired number of pulses within the data detector 403, thus ensuring a sufficient sample population for evaluation of the sense count. In an alternative embodiment, the error detection interval may be framed by a time interval (e.g., a fixed or programmable number of clock cycles) and the data pulse count accumulated within the time interval compared with a threshold value to ensure sufficient sample population. After the data counter reaches the terminal count, X, the sense counter and data counter are disabled at block 455, and the sense count (i.e., content of the sense counter) is compared in decision blocks 457 and 461 with a value, $X/2\pm\epsilon$, that corresponds to 50% of the population size (i.e., 50% of the total pulse count) plus or minus a tolerance value, $\epsilon$. If the sense count is outside the desired range (i.e., tolerance band established by $\epsilon$ and centered around X/2), the sense gain control value is decremented or incremented by a value n, and the data gain control value is correspondingly decremented or incremented by a value k*n, where k is the scaling factor between the sense and data control values. More specifically, as shown at 457 and 459, if the sense count is above the desired range, then the sense gain is deemed to be too high and the sense gain control value is therefore decremented (and the data gain control value correspondingly decremented) at 459. If the sense count is below the desired range, then the sense gain is deemed to be too low and the sense gain control value and data gain control value are incremented at 463. In one embodiment, the gain control update operation is repeated, starting at 451, if the sense count is determined to be outside the desired range in decision blocks 457 or 461. Alternatively, the gain control update operation may be concluded (i.e. at "End AGC") and then restarted at a later time. For example, the gain control update operation shown in FIG. 9 may be executed periodically or occasionally in response to a control signal from other control logic within the host integrated circuit or in response to an instruction or command from a remote device. Similarly, if the sense count falls within the desired range, no gain control adjustment is performed and the gain control update may be concluded as shown in FIG. 9 or restarted at 451 immediately or after a delay interval.

Still referring to FIG. 9, the tolerance value, $\epsilon$, establishes a deadband in which the sense gain control value, though not precisely at the 50% setting, is close enough for gain setting purposes and thus may be used to inhibit gain control adjustment and thereby avoid undue dither in the data gain control setting and/or unnecessary power consumption in the gain control update operation. In one embodiment, the tolerance value is a programmable value (e.g., stored within a volatile or non-volatile storage circuit within the host IC device in response to instruction from an external system component or production time programming equipment) and may be set to any value extending from zero to a practicable maximum. In applications where the tolerance value is unnecessary, circuitry and/or programming in support of the tolerance value may be omitted.

FIG. 10 illustrates an alternative embodiment of a pulse-coded signal receiver 470 having a digital AGC circuit 471 that determines a gain control value 422 (GC) in generally the same manner as the digital AGC circuit 405 of FIG. 7, but through time-multiplexed operation of a single variable-gain amplifier 275 and hysteretic detector 277 instead of dual signal detection channels. In the particular embodiment shown, the digital AGC circuit 471 includes an edge detector 415 and counter 419 that operate generally as described in reference to FIG. 7. That is, the edge detector 415 detects positive and/or negative transitions in the received data signal 278 output by the hysteretic detector and asserts a count-enable signal 414 in response to each. The counter 419 increments (or decrements) a pulse count 418 in response to the count-enable signal assertions and thus counts the number of pulses detected within the hysteretic detector 277 during a given error detection interval. The digital AGC circuit 471 additionally includes a controller 473 which responds to assertion of a calibrate signal 472 (e.g., provided from other control circuitry within the host device or a programmable storage circuit such as a mode register or the like) by transitioning from a data-reception mode to a calibration mode. In the calibration mode, the controller 473 enables operation of the edge detector and counter (e.g., through assertion of enable signal 426 or multiple enable signals) and initiates operations to update the gain control value 422, as described in further detail below. In the data-reception mode, updates to the gain control value 422 are suspended and components of the digital AGC circuit 471 may be disabled (or not clocked or otherwise prevented from operating) to save power.

In one embodiment, the controller 473 includes separate gain control memory circuits 475 and 477 to store a data gain control value, dGC, and a sense gain control value, sGC, respectively. As discussed below, the controller 473 alternately selects, via multiplexer 479, either the sense gain control value or the data gain control value to be output as the gain control value 422 (GC) and applied within the variable-gain amplifier 275 during the calibration and data-reception modes. More specifically, in the data-reception mode (i.e., calibrate signal 472 deasserted), the data gain control value is supplied to amplifier 275 to establish a desired level of signal amplification, and during calibration mode or at least portions thereof, the sense gain control value is supplied to amplifier 275 to enable determination of the 50% gain control setting described above. As with controller 423 of FIG. 7 and all other control circuitry described herein, controller 473 may be implemented by a state machine, processor (e.g., microcontroller), sequencer or any other type of control circuitry.

FIG. 11 illustrates an exemplary gain control update operation that may be carried out by the controller 473 of FIG. 10. In one embodiment, the controller 473 initiates the gain control update operation upon entering a calibration mode (i.e., in response to assertion of the calibrate signal 472) and starts at 501 by selecting the sense gain control value (sGC) to be output to the variable-gain amplifier 501. At 503, the controller 473 enables and resets the counter 419, for example, by asserting the enable signal 426 shown in FIG. 10 (which may also be supplied to the edge detector 415 to enable edge detection operation therein). Thereafter, the host integrated circuit device coordinates or negotiates with a remote device to initiate transmission of a training pattern having a predetermined number (X) of pulses. The incoming pulses are amplified by amplifier 275 to produce amplified signal 276 in which pulses that are amplified to levels that exceed the toggle threshold of the hysteretic detector 277 produce transitions in received data signal 278 that are detected by the edge detector 415 and counted by the counter 419. Accordingly, after the training pattern has been transmitted (which may be determined by the controller 473, for example, by determining that a predetermined number of clock cycles have transpired or based on occurrence of other events), the counter 419 is disabled at 507. The pulse count 418 is then compared with upper and lower bounds of a tolerance band in decision blocks 509 and 513. As in the embodiment of FIG. 9, if the pulse count 418 exceeds the upper bound of the tolerance band (i.e., $>X/2+\epsilon$), the sense gain control value is decremented at by n to reduce the gain of amplifier 275 and the data gain control value is correspondingly decremented by k*n ('*' denoting multiplication) to maintain the scaled relationship between the sense gain control value and data gain control value. This operation is shown in FIG. 11 at 511. Similarly, if the pulse count 418 falls below the lower bound of the tolerance band (i.e., $<X/2-\epsilon$), the sense gain control value is incremented by n to increase the gain of amplifier 275 and the data gain control value is correspondingly incremented by k*n as shown at 515. In one embodiment, after adjusting the gain control values at either 511 or 515, the gain control update operation is repeated starting at 503. Alternatively, the gain control update operation may be concluded by selecting the data gain control value to be output as the applied gain control value, GC 422 (i.e., as shown at 517 of FIG. 10), thereby enabling iteration of the FIG. 11 gain control update operation to be controlled by other logic within the host integrated circuit device, or by a remote device. If the pulse count 418 is determined to fall within the desired range in blocks 509 and 513, neither the sense gain control value nor the data gain control value is updated, and the gain control update operation is concluded by selecting the data gain control value to be output as the applied gain control value (GC) as shown at 517. As in the embodiment of FIG. 9, the gain control update operation may alternatively be executed iteratively regardless of whether the pulse count falls 418 within or outside the desired range.

Still referring to FIG. 11, in an alternative embodiment the training pattern may be transmitted and detected twice per execution of a gain control update operation. For example, the training pattern may initially be detected with the data gain control value applied within amplifier 275, thereby enabling a determination of the number of pulses (X) present in the pattern and/or the length of the training pattern. Thereafter, the training pattern may be detected with the sense gain control value applied within amplifier 275 to determine whether the resulting pulse count falls within the tolerance band (i.e., determine whether the 50% setting has been reached or nearly reached).

In the signal receiver embodiments of FIGS. 7 and 10, the sense gain control and data gain control may optionally be initialized to nominal values, for example in a programming operation in response to instruction from a remote device. Also, instead of maintaining separate sense and data gain control values, one value may be synthesized from the other based on the scaling factor, k, thus obviating separate gain control memories. Further, in the gain update operations described in reference to FIGS. 9 and 11, coarse updates (i.e., coarse or relatively large value of n and k*n) may be applied initially to enable rapid adaptation of the sense and data gain control value toward their ultimate setpoints, followed by finer-grained updates (i.e., smaller values of n and k*n) to enable the desired setpoints to be reached. The transition from coarse updates to fine updates may be managed by the controller (423 or 473), for example, in response to detecting that the gain control update value is dithering. Further, in an embodiment in which positive and negative gain control values are separately calibrated, it may be desirable to provide different tolerance bands (i.e., different fixed or programmable values of $\epsilon$ to be applied in the positive and negative gain control updates), different fixed or programmable step-sizes (n and n*k) and/or different fixed or programmable scaling factors, k, between the sense and data gain control values. Also, it bears noting that gain control update operations may be carried out simultaneously with reception of live data (i.e., in distinction to test data or training data) in the embodiment of FIG. 7, so that no signaling bandwidth need be consumed to calibrate the gain setting of the signal receiver 400. On the other hand, in comparison to signal receiver 400, the signal receiver 470 of FIG. 10 reduces capacitive loading of the signaling link, has a smaller I/O circuit footprint and avoids calibration errors that might arise due to component variations in the dual detection paths of the FIG. 7 embodiment.

FIGS. 12A and 12B illustrate exemplary embodiments of edge detectors 530 and 540, respectively, that may be used to implement the data-edge and sense-edge detectors 415 and 417 of FIG. 7 and the edge detector 415 of FIG. 10. Referring first to FIG. 12A, edge-triggered storage element 531 (a flip-flop in this example) and exclusive-OR gate 533 are used to generate a one-clock-cycle pulse in response to each rising or falling edge in the output signal 278 from a hysteretic detector. More specifically, by clocking flip-flop 531 with a timing signal (not shown) that frames the incoming data reception intervals, if detector output signal 278 transitions from low to high, or from high to low, the clock-cycle latency in the output 532 of flip-flop 531 will result in a difference between the signals 278 and 532 supplied to the XOR gate 533 over the ensuing clock cycle, and thus the XOR gate 533 will output a single-cycle pulse that may be detected by the pulse counters described above.

FIG. 12B illustrates an embodiment of a multi-mode edge detector 540 that provides mode-selectable detection of either falling-edge transitions, rising-edge transitions, or both falling- and rising-edge transitions in the hysteretic detector output 278. As shown, edge detector 540 includes edge-triggered storage element 531 and exclusive-OR gate 533 coupled as described in reference to FIG. 12A, and additionally includes logic AND gates 541 and 543, each having a first input coupled to receive the output 278 of a hysteretic detector and a second input to receive the latent output of the edge-triggered storage element 531. The hysteretic detector output 278 is inverted at the first input of AND gate 543 so that the output of the AND gate 543 will go high only in response to transitions of the detector output 278 that end in a low hysteretic detector output 278 and therefore only in response to falling-edge transitions. More specifically, during the clock cycle that follows a falling-edge transition, the high storage-element output 532 (i.e., high due to latency by one clock cycle relative to signal 278) and low state of signal 278 will cause the output of AND gate 543 to go high and thus yield a pulse at the falling-edge input (fe) of multiplexer 545 to signal detection of the falling edge. Conversely, the output of storage element 531 is inverted at the second input of AND gate 541 so that the output of AND gate 541 will go high only in response to rising-edge transitions of the detector output 278. That is, during the clock cycle that follows a rising edge transition, the low storage-element output 532 and high state of signal 278 will cause the output of AND gate 541 to go high and thus yield a pulse at the rising-edge (re) input of multiplexer 545 to signal detection of the rising edge. As discussed, the output of XOR gate 533 will go high for one clock cycle in response to all transitions of the hysteretic detector output 278 and thus will yield a pulse at the all-edge (all) input of multiplexer 545 to signal detection of a rising or falling edge. The multiplexer 545 responds to an edge-detection mode signal 546 (EDM), which may be a programmable value and/or controlled by the controllers 423 and 479 of FIGS. 7 and 10 to select either a falling-edge detection mode (i.e., passing the falling-edge detection signals from AND gate 543), rising-edge mode detection mode (passing the rising-edge detection signals from AND gate 541) or all-edge detection mode (passing the edge detection signals from exclusive-OR gate 533). In an alternative embodiment in which multiplexer 545 is implemented by a 2,2 And-Or-Invert (AOI) gate, the all-edge input to the multiplexer and exclusive-OR gate may be omitted, and the edge-detection mode signal 546 may be supplied to the AOI gate to enable the output of gate 543, the output of gate 541, or the outputs of both gates 541 and 543 to appear at the multiplexer output. Other circuits for generating rising-edge, falling-edge and/or all-edge edge-detection signals may be used in alternative embodiments.

Still referring to FIG. 12B, the different edge detection modes may be selected, for example, to enable adaptive calibration of separate positive and negative gain control values such as those applied within the variable-gain amplifiers of FIG. 6A and 6B (i.e., pGC[N−1:0] and nGC[N−1:0]). That is, to adjust the positive gain control value, the edge detection mode is set to enable detection of rising edges in the hysteretic detector output 278 (i.e., corresponding to high-going pulses in a pulse-coded input signal) and the operations described in reference to FIG. 9 or 11, for example, may be carried out to adjust the positive gain control value. After each update to the positive gain control value, the edge detection mode may be switched to enable detection of falling edges in the hysteretic detector output 278 (i.e., corresponding to low-going pulses in the pulse-coded input signal) and the operations described in reference to FIG. 9 or 11 carried out to adjust the negative gain control value. By this operation, the positive and negative gain control values may be alternately updated to establish respective levels of amplification for positive and negative pulses in the input signal. In an alternative embodiment, the positive gain control value may be iteratively adjusted to establish a desired amplification level before iteratively adjusting the negative gain control value, or vice-versa.

In one embodiment, after the positive and negative gain control values have been adjusted to achieve desired amplification levels (e.g., sense gain control value yields numbers of positive and negative pulses), the edge detection mode may be switched to select both positive and negative pulses for any further gain control update operations, thus maintaining the positive and negative gain control values in lock step relative to one another after their initial determination. Alternatively, the positive and negative gain control values may continue to be separately adjusted in periodic or occasional gain control update operations. In the latter case, the exclusive-OR gate and corresponding all-edge path in multiplexer 545 may be omitted from the multi-mode edge detector of FIG. 12B.

Figure 13B:
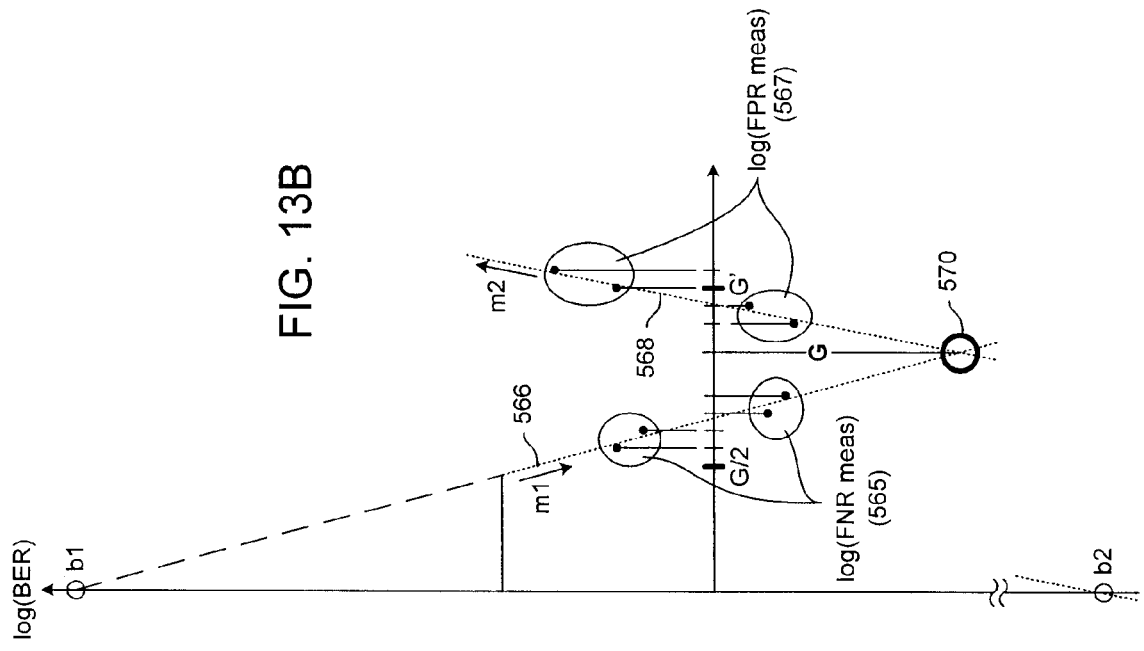
FIGS. 13A and 13B illustrate an alternative technique for determining a gain control value to be applied within a variable-gain amplifier.
Figure 13A:
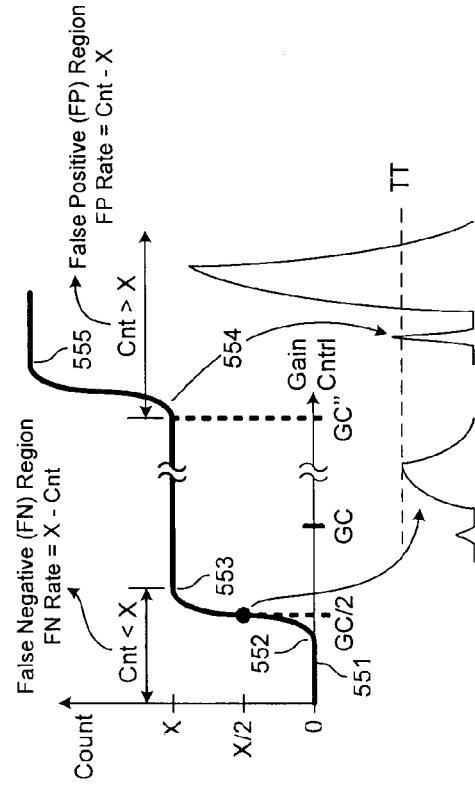

FIGS. 13A and 13B illustrate an alternative technique for adaptively or automatically determining a gain control value to be applied within a variable-gain amplifier. Referring first to FIG. 13A, which is a plot of pulse detection versus gain control setting, it can be seen that if the gain control value is stepped through a range from zero to an extreme level, GC", that amplifies the noise floor above the toggle-threshold of the hysteretic detector, the pulse count obtained within the edge-detect/counter arrangement of FIG. 7 or FIG. 10 will have the profile shown. That is, the pulse count will be zero or near zero over the range of gain control values that do not amplify the incoming pulses above the toggle-threshold of the hysteretic detector (i.e., gain control range 551). The pulse count begins to rise as the gain control value is increased to a point 552 at which at least some pulses in the incoming signal are amplified above the toggle-threshold, yielding a determination of the 50% setting (shown as GC/2) when half (X/2) the total number of pulses (X) are detected. As the gain control value is raised above the 50% setting, the pulse count rapidly rises to a point 553, at which all the incoming pulses are amplified above the toggle threshold of the hysteretic detector (i.e., pulse count=X). Continuing, if the gain control value is increased further, at some extreme value of the gain control value, GC", spurious pulses (e.g., noise or other transients) will begin to be amplified above the toggle threshold of the hysteretic detector, thus yielding a pulse count that exceeds the number (X) of legitimate pulses in the incoming signal. As the gain control value is further raised, noise spikes will increasingly be amplified above the toggle threshold (e.g., as shown at 554) so that the pulse count will continue to increase until, at some point 555, the toggle-threshold crossings are so frequent that the toggle bandwidth of the hysteretic detector (and/or the maximum edge-detection rate in the edge-detector) is exceeded, in effect saturating the pulse counting circuitry.

Still referring to FIG. 13A, the range of gain control values for which fewer than all the incoming pulses are detected (count<X) and for which more than all the incoming pulses are detected (count>X), constitute gain ranges in which bit error rates may be quantified according to the difference between the number of expected pulses and the number of counted pulses. In the gain range that yields a pulse count less than X, the bit error rate represents the rate at which valid (legitimate) pulses in the incoming signal are missed (false negatives) and is referred to as the false-negative rate (FNR). Similarly, in the gain range that yields a count greater than X, the bit error rate represents the rate at which undesired (i.e., spurious, non-valid or illegitimate) transitions in the incoming signal are erroneously detected (false positives) and is referred to herein as the false-positive rate (FPR). As shown, the false-negative and false-positive rates may be expressed as "count-X" and "X-count," respectively. Accordingly, the false-negative rate represents the number of missed pulses over a given time interval (i.e., pulses expected less pulses detected) while the false-positive rate represents the number of spurious pulses detected over a given time interval (i.e., pulses detected less pulses expected). In embodiments in which the sample size, X, is variable (e.g., programmable), the 'count-X' and 'X-count' values may be divided by X to yield false-negative and false-positive rates that are independent of the sample size.

In one embodiment, samples of the false-negative and false-positive rates determined at selected gain control values within the false-negative and false-positive gain ranges are used to estimate the false-negative and false-positive rates as a functions of the gain control value. In a particular embodiment, illustrated in FIG. 13B, a Gaussian bit-error distribution is assumed within the false-negative and false-positive gain ranges so that the log of the false-negative and false-positive rates determined at selected gain control values within those ranges will yield respective sets of error sample points 565 and 567, that may applied in statistical determinations of best-fit lines 566 and 568 (or other curves) that constitute estimations of the false-positive and false-negative rates as a functions of the gain control value. The best-fit lines 566 and 568 have inverse slopes and thus intersect one another at a gain control value 570 (G) that yields equal (or balanced or matched) false-negative and false-positive rate estimates. Accordingly, by solving the simultaneous equations for the best-fit lines 566 and 568 to determine the gain control value 570 that yields equal false-negative and false-positive rate estimates, a gain control value that, at least in estimation, yields the minimum total bit error rate may be determined. Specifically, as the false-negative and false-positive error rate estimates may be expressed analytically by log(FNR)=m1 (GC)+b1 and log(FPR)=m2(GC)+b2, respectively, (m1 and m2 being the slopes and b1 and b2 being the y-intercepts of best-fit lines as shown in FIG. 13B) the gain control value, GC, that yields the estimated minimum bit error rate may be determined as: $GC_{minBER}=(b2-b1)/(m1-m2)$. Where other best-fit curve functions are applied (e.g., where bit error rates are more accurately modeled by non-Gaussian expressions), other combinations of curve coefficients may be combined to generate the $GC_{minBER}$ value.

Figure 14:
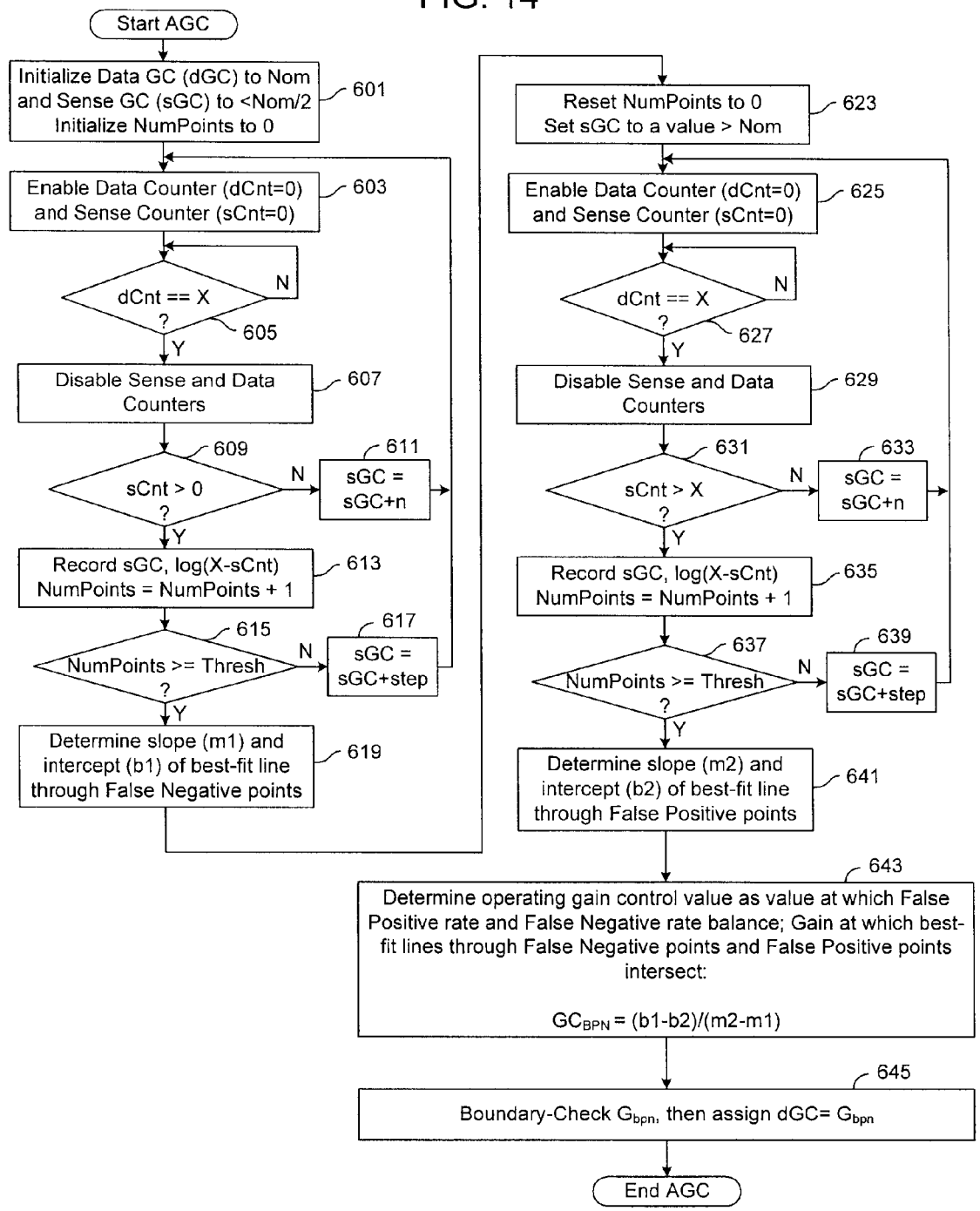
FIG. 14 illustrates an exemplary approach that may be applied within the signal receiver of FIG. 7 to determine a gain control value at which estimated false-negative and false-positive rates balance.

FIG. 14 illustrates an exemplary approach that may be applied within the signal receiver 400 of FIG. 7 to determine a gain control value at which estimated false-negative and false-positive rates balance. At 601, the data gain control value (dGC, the gain control value applied within data amplifier 401 of FIG. 7) is initialized to a nominal value, Nom, and the sense gain control value (sGC, the gain control value applied within sense amplifier 409) is initialized to a value sufficiently below 50% of the nominal value (i.e., <Nom/2) to ensure that the sense gain control value may be incrementally stepped through a false-negative gain region. A count value, NumPoints, is also initialized to zero. At 603, the data counter and sense counter (i.e., elements 419 and 421 of FIG. 7) are enabled and the sense and data counts therein reset to zero or another initial value (e.g., dCnt=0, sCnt=0). The data and sense counters remain enabled to count data and sense signal transitions until the data counter reaches a terminal count value, X, as indicated by decision block 605 and the negative branch back to the decision block 605 input. At 607, the sense and data counters are disabled, and at decision block 609, the sense count is evaluated to determine if at least some pulses in the input signal have been detected by the sense detector (i.e., sCnt >0?) and, thus, whether a gain-sensitive region of the false-negative gain range has been reached. If no pulses have been detected by the sense detector, the sense gain control value is incremented by value n to raise the gain of the sense amplifier toward the gain-sensitive region. Note that, while not specifically shown, the sense count may also be compared with X to ensure that the sense gain control value is not beyond the false-negative gain range (i.e., sCnt<X) and, if so, to decrease the gain control value. Also, in one embodiment, the terminal count value, X (which may be a programmable value), may be adapted according to the false-negative rate. That is, if the false-negative rate is determined to be low, the value of X (i.e., the sample size) may be increased to obtain a statistically more meaningful measurement.

Still referring to FIG. 14, if the sense count indicates that the sense amplifier gain is within the gain-sensitive region of the false-negative gain range (e.g., 0<sCnt<X), the sense gain control value is recorded at 613 along with a log of the false-negative error rate, log (X−sCnt), in a table of false-negative rate measurements (e.g., an array, structure or other data storage arrangement) and a count of the number of false-negative measurements, NumPoints, is incremented. As discussed above, the 'X−sCnt' value may be divided by X to yield a false-negative error rate that is independent of the sample size, X. At decision block 615, the measurement count, NumPoints, is evaluated to determine if a threshold number (Thresh, which may be a fixed or programmable value) of false-negative measurements have been recorded. If not, the sense gain control value is incremented by a gain-step value (step) at 617 and the operations starting at 603 are repeated to obtain another error rate measurement in the false-negative gain range. If a threshold number of measurements have been recorded (i.e., NumPoints greater than or equal to Thresh), the slope (m1) and intercept (bi) of a best-fit line through the recorded false-negative measurements (i.e., points) is determined at 619, for example, using linear regression or other curve-fitting techniques. Note that, instead of determining whether a threshold number of measurements have been recorded, false-negative measurements may continue to be obtained for progressively increased sense gain control values until no false-negatives are detected. Also, curves other than lines may be fit to the recorded measurements in alternative embodiments, and the best-fit curve may be determined iteratively, for example, with outlier removal after each determination of curve coefficients followed by repetition of the best-fit determination without the outlier measurement(s). In cases where outlier removal leaves an insufficient measurement population (i.e., insufficient number of measurements), the operations starting at 603 may be repeated to obtain additional false-negative rate measurements.

After the coefficients of a best-fit curve are determined (i.e., slope and intercept of a line in FIG. 14), the measurement count, NumPoints, is reset to zero at block 623 and the sense gain control value is set to a value greater than the nominal receiver gain (i.e., >Nom) in preparation for error rate measurements in the false-positive gain range. Thus, at 625, the data counter and sense counter are enabled and reset, and allowed to count pulse detections until the data counter reaches a terminal count value, X (determined at decision block 627). After the data counter reaches the terminal count value, the data counter and sense counter are disabled at 629, and the sense count compared with the terminal count at 631 to determine whether any false-positive detections occurred (i.e., whether sCnt>X) and thus whether the false-positive gain range has been entered. If not, then the sense gain control value is incremented at 633 by a value n (which may be the same or different from the increment applied in block 611), and the operations starting at block 625 repeated to generate a new sense count at the increased gain control value. Note that, while not specifically shown, the sense count may also be compared with a saturation value (S) that represents the maximum possible count that may have been reached during the error detection interval to ensure that the sense gain control value remains within a gain-sensitive region of the false-positive gain range (i.e., sCnt<S) and, if not, to decrease the sense gain control value to find the start of the false-positive gain range.

Still referring to FIG. 14, if the sense count indicates that the sense amplifier gain is within the gain-sensitive region of the false-positive gain range (e.g., X<sCnt<S), the sense gain control value is recorded at 635 along with a log of the false-positive error rate, log (sCnt−X), in a table of false-positive rate measurements, and a count of the number of false-positive rate measurements, NumPoints, is incremented. As discussed above, the 'sCnt−X' value may be divided by X to yield a false-positive error rate that is independent of the sample size, X. At 637, the number of recorded measurements is evaluated to determine if a threshold number of false-positive rate measurements (Thresh, which may be the same or different from the threshold applied in block 615 have been recorded. If not, the sense gain control value is incremented by a gain-step value at 639 (i.e., incremented by a value, step, which also may be the same or different from the step size applied at 617) and the operations starting at 625 repeated to obtain another error rate measurement in the false-positive gain range. If a threshold number of measurements have been recorded (i.e., NumPoints greater than or equal to Thresh), the slope (m2) and intercept (b2) of a best-fit line through the recorded false-positive measurements (i.e., points) is determined at 641. As discussed, curves other than lines may be fit to the recorded measurements in alternative embodiments, and/or the best-fit curve may be determined iteratively (e.g., with outlier removal and repetition of best-fit determination and, if necessary, repetition of the measurement operations starting at 625 to obtain additional measurements).

At 643, after coefficients of best-fit lines or other curves for the false-negative and false-positive error rate measurements have been determined, the coefficients are applied to determine an operating gain control value, $GC_{BPN}$, that balances the estimated false-positive and false-negative error rates (i.e., represented by the best-fit curves). More specifically, in the embodiment of FIG. 14, the operating gain control value is assigned the value at which the best-fit curves yield equal bit error rates (i.e., the intersection point of the two best-fit curves) which, in the case of linear best-fit curves may be determined by: $GC_{BPN}=(b1-b2)/(m2-m1)$. As shown at 645, the operating gain control value may optionally be boundary checked to ensure that is within fixed, programmed or computed boundaries (i.e., to ensure that an out-of-range gain control value is not applied within the data amplifier), and is then output to the data amplifier as the data gain control value, dGC.

Although described in the context of the dual-detector signal receiver of FIG. 7, it should be noted that the overall gain control determination operation of FIG. 14 may also be carried out within a single-detector signal receiver of FIG. 10, for example, by leveraging the training pattern techniques described in reference to FIG. 11. Thus, the measurement operations at blocks 603-607 and 625-629 of FIG. 14 may alternatively be carried out using the operations described in reference to blocks 503-507 of FIG. 11. Also, the gain control determination operation of FIG. 14 may be separately executed in conjunction with positive transition detection (i.e., as described in reference to FIG. 12B) to determine a positive gain control value, and then in conjunction with negative transition detection to establish a negative gain control value. Thereafter, the gain control operation of FIG. 14 may be periodically or occasionally repeated to compensate for run-time changes in voltage or temperature or other sources of drift.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which logical elements may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied in combination with any other of the embodiments or in place of counterpart features or aspects thereof. Accordingly, the specification and drawings are to be regarded in an illustrative rather than a restrictive sense.

What is claimed is:

1. An integrated circuit device comprising:
   a variable-gain amplifier to generate an amplified signal having an amplitude according to a digital gain control value; and
   digital gain control circuitry to generate a sequence of digital samples that corresponds to the amplified signal, and to iteratively adjust the digital gain control value based on the sequence of digital samples.

2. The integrated circuit device of claim 1 wherein the digital gain control circuitry comprises an inhibit input to receive an inhibit signal, and wherein the digital gain control circuitry is enabled to adjust the digital gain control value when the inhibit signal is in a first state and inhibited from adjusting the digital gain control value when the inhibit signal is in a second state.

3. The integrated circuit device of claim 1 wherein the digital gain control circuitry comprises:
   a memory circuit to both store the digital gain control value and provide the digital gain control value to the variable-gain amplifier during a first interval;
   an analog-to-digital converter to generate the sequence of digital samples based on the amplified signal; and
   an update circuit to generate an updated digital gain control value during the first interval based on the sequence of digital samples, and to output the updated digital gain control value to the memory circuit to be stored therein at the conclusion of the first interval.

4. The integrated circuit device of claim 3 wherein the update circuit comprises:
   a digital detector to detect a peak digital sample within the sequence of digital samples; and
   a digital comparator circuit to compare the peak digital sample with a digital value that represents a desired signal amplitude.

5. The integrated circuit device of claim 1 wherein the amplified signal is an amplified pulse-mode signal having a respective pulse for each change in state within a sequence of transmit data bits, and wherein the digital gain control circuitry further comprises a first detector to detect pulses in the amplified pulse-mode signal that exceed a first threshold and to toggle a received data signal between binary states in response to detecting pulses in the amplified pulse-mode signal.

6. The integrated circuit device of claim 5 wherein the digital gain control circuitry further comprises a second detector to detect pulses in the amplified pulse-mode signal that exceed a second threshold, the second threshold being higher than the first threshold.

7. The integrated circuit device of claim 6 wherein the digital gain control circuitry further comprises logic circuitry to adjust the digital gain control value based, at least in part, on a comparison of a number of pulses detected by the first detector and a number of pulses detected by the second detector.

8. The integrated circuit device of claim 7 wherein the logic circuitry includes a controller to increase the digital gain control value if the number of pulses detected by the second detector is less than a first predetermined fraction of the number of pulses detected by the first detector, and to decrease the digital gain control value if the number of pulses detected by the second detector is greater than a second predetermined fraction of the number of pulses detected by the first detector.

9. The integrated circuit device of claim 8 wherein the first predetermined fraction is equal to a predetermined percentage of the number of pulses detected by the first detector less a tolerance value, and wherein the second predetermined fraction is equal to the predetermined percentage of the number of pulses detected by the first detector plus the tolerance value, and wherein the tolerance value ranges from zero to a maximum tolerance value.

10. A method of operation within an integrated circuit device, the method comprising:
generating an amplified signal having an amplitude according to a digital gain control value;
generating a sequence of digital samples that corresponds to the amplified signal; and
iteratively adjusting the digital gain control value based on the sequence of digital samples.

11. The method of claim 10 wherein iteratively adjusting the digital gain control value comprises:
storing the digital gain control value in a storage circuit during a first interval;
generating an adjusted digital gain control value based on the sequence of digital samples during the first interval; and
storing the adjusted digital gain control value in the storage circuit at the conclusion of the first interval.

12. The method of claim 11 wherein generating an adjusted digital gain control value comprises:
detecting a peak digital sample within the sequence of digital samples; and
comparing the peak digital sample with a digital value that represents a desired signal amplitude.

13. The method of claim 10 wherein further comprising selectively inhibiting iterative adjustment of the digital gain control value.

14. The method of claim 13 wherein selectively inhibiting iterative adjustment of the digital gain control value comprises:
determining whether the amplitude of the amplified signal is within a desired range; and
inhibiting iterative adjustment of the digital gain control value in response to determining that the amplitude is within the desired range.

15. The method of claim 14 wherein determining whether the amplitude is within the desired range comprises periodically determining whether the amplitude is within the desired range.

16. An integrated circuit device comprising:
a first variable-gain amplifier to generate a first amplified signal having an amplitude according to a first gain control value;
a first hysteretic detector to receive the first amplified signal and to generate a first sequence of received data values based on transitions in the first amplified signal;
gain control logic circuitry to receive the first sequence of received data values and to iteratively adjust the first gain control value until a desired number of transitions in the first amplified signal are determined to cross a threshold, and to generate a second gain control value based on the first gain control value;
a second variable-gain amplifier to generate, when the input signal is received, a second amplified signal having an amplitude according to the second gain control value, the second gain control value being based on the first gain control value; and
a second hysteretic detector to receive the second amplified signal and to generate a second sequence of received data values based on transitions in the second amplified signal.

17. The integrated circuit device of claim 16 wherein the threshold includes upper and lower thresholds, and wherein the gain control logic circuitry further comprises:
circuitry to determine a first number of rising-edge transitions that cross the upper threshold and a second number of falling-edge transitions that cross the lower threshold; and
circuitry to iteratively adjust the first gain control value until a sum of the first number and the second number falls within a desired range of transitions.

18. The integrated circuit device of claim 16 wherein the second gain control value is different from the first gain control value and bears a predetermined mathematical relationship to the first gain control value.

19. An integrated circuit device comprising:
a variable-gain amplifier to receive an input signal and to generate an amplified signal having an amplitude according to a gain control value;
a hysteretic detector to receive the amplified signal and to generate a sequence of received data values based on transitions in the amplified signal;
circuitry to estimate a first bit error rate as a function of the gain applied within the variable-gain amplifier by determining respective numbers of non-detected input signal transitions at corresponding values of the gain;
circuitry to estimate a second bit error rate as a function of the gain applied within the variable-gain amplifier by determining respective numbers of spurious input signal transitions at corresponding values of the gain;
circuitry to determine an operating gain at which the first bit error rate and the second bit error rate are substantially balanced; and
circuitry to output the operating gain as the gain control value.

20. The integrated circuit device of claim 19 wherein circuitry to determine an operating gain at which the first bit error rate and the second bit error rate are substantially balanced further comprises:
circuitry to generate coefficients of a first polynomial function of gain that corresponds to the numbers of non-detected input signal transitions and corresponding values of the gain;
circuitry to generate coefficients of a second polynomial function of gain that corresponds to the numbers of spurious input signal transitions and corresponding values of the gain; and
circuitry to determine, as the operating gain, the gain at which the first and second polynomial functions yield matching bit error rates.

* * * * *